US009553187B2

(12) United States Patent
Chen et al.

(10) Patent No.: US 9,553,187 B2
(45) Date of Patent: Jan. 24, 2017

(54) SEMICONDUCTOR DEVICE AND RELATED FABRICATION METHODS

(71) Applicants: Weize Chen, Phoenix, AZ (US); Richard J. De Souza, Chandler, AZ (US); Mazhar Ul Hoque, Gilbert, AZ (US); Patrice M. Parris, Phoenix, AZ (US)

(72) Inventors: Weize Chen, Phoenix, AZ (US); Richard J. De Souza, Chandler, AZ (US); Mazhar Ul Hoque, Gilbert, AZ (US); Patrice M. Parris, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/567,357

(22) Filed: Dec. 11, 2014

(65) Prior Publication Data

US 2016/0172489 A1    Jun. 16, 2016

(51) Int. Cl.
*H01L 29/78*    (2006.01)
*H01L 29/66*    (2006.01)
(Continued)

(52) U.S. Cl.
CPC ..... *H01L 29/7835* (2013.01); *H01L 21/28105* (2013.01); *H01L 27/0251* (2013.01);
(Continued)

(58) Field of Classification Search
CPC ............. H01L 29/7835; H01L 29/4933; H01L 21/28105; H01L 29/4983; H01L 27/0251; H01L 29/66659
See application file for complete search history.

(56) References Cited

U.S. PATENT DOCUMENTS 5,346,835 A * 9/1994 Malhi ............... H01L 27/088
148/DIG. 126
6,043,532 A * 3/2000 Depetro ............ H01L 29/0696
257/335
(Continued)

OTHER PUBLICATIONS

Khemka,V., et al., "Detection and Optimization of Temperature Distribution Across Large-Area Power MOSFETs to Improve Energy Capability," IEEE Transactions on Electron Devices, vol. 51. No. 6, Jun. 2004.
(Continued)

*Primary Examiner* — Jarrett Stark (57) ABSTRACT

Semiconductor device structures and related fabrication methods are provided. An exemplary semiconductor device structure includes a body well region having a first conductivity type, a drift region and a source region each having a second conductivity type, where a channel portion of the body well region resides laterally between the source region and a first portion of the drift region that is adjacent to the channel portion. A gate structure overlies the channel portion and the adjacent portion of the drift region. A portion of the gate structure overlying the channel portion proximate the source region has the second conductivity type. Another portion of the gate structure that overlies the adjacent portion of the drift region has a different doping, and overlaps at least a portion of the channel portion, with the threshold voltage associated with the gate structure being influenced by the amount of overlap.

19 Claims, 5 Drawing Sheets

(51) Int. Cl.
*H01L 27/02* (2006.01)
*H01L 21/28* (2006.01)
*H01L 29/49* (2006.01)

(52) U.S. Cl.
CPC ...... *H01L 29/4933* (2013.01); *H01L 29/4983* (2013.01); *H01L 29/66659* (2013.01)

(56) References Cited

U.S. PATENT DOCUMENTS

| | | | |
|---|---|---|---|
| 6,064,088 A * | 5/2000 | D'Anna | H01L 29/0692 257/341 |
| 6,097,070 A * | 8/2000 | Mandelman | H01L 21/28114 257/333 |
| 6,150,722 A * | 11/2000 | Efland | H01L 23/4824 257/343 |
| 6,744,101 B2 * | 6/2004 | Long | H01L 21/28105 257/324 |
| 7,315,067 B2 * | 1/2008 | Wang | H01L 29/4916 257/412 |
| 8,735,983 B2 * | 5/2014 | Liu | H01L 29/4983 257/344 |
| 2005/0012088 A1 * | 1/2005 | Ohuchi | H01L 21/2807 257/19 |
| 2010/0109080 A1 * | 5/2010 | Huang | H01L 29/0847 257/335 |
| 2013/0168767 A1 * | 7/2013 | Lin | H01L 27/0727 257/337 |
| 2013/0181286 A1 * | 7/2013 | Zhang | H01L 29/4983 257/335 |
| 2014/0054694 A1 * | 2/2014 | Min | H01L 29/66659 257/336 |

OTHER PUBLICATIONS

Yang, H et al., US Patent Application entitled "Composite Semiconductor Device With Multiple Threshold Voltages," filed May 7, 2014.

* cited by examiner

023
SEMICONDUCTOR DEVICE AND RELATED FABRICATION METHODS

TECHNICAL FIELD

Embodiments of the subject matter described herein relate generally to semiconductor devices and methods for fabricating semiconductor devices, and more particularly, embodiments of the subject matter relate to methods for fabricating semiconductor devices having increased thermal safe operating area.

BACKGROUND

During normal operation, the current flowing through a semiconductor device causes the temperature of the semiconductor device to increase as a byproduct of the power dissipated by the resistance of the device. The increase in temperature can lead to thermal runaway or otherwise impair functionality of the semiconductor device, particularly in response to large currents (e.g., during an electrostatic discharge (ESD) event, inductive switching, or the like). The desire to improve the current or temperature handling capabilities of a device must often be balanced against competing desires to achieve a particular level of performance while minimizing fabrication process costs and complexity.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures, which are not necessarily drawn to scale.

FIG. 2 depicts a top view of the semiconductor device structure of FIG. 1, where FIG. 1 depicts a cross-sectional view along the line 1-1 in FIG. 2;

DETAILED DESCRIPTION

Embodiments of the present invention relate to semiconductor devices having one or more threshold voltages tuned to achieve a desired temperature distribution across the semiconductor device during operation, thereby improving the thermal safe operating area (T-SOA). As described in greater detail below, a gate structure of a semiconductor device includes a doped portion configured to reduce the overdrive voltage (or increase the threshold voltage), alternatively referred to herein as a throttling region or throttling portion. The throttling region overlaps the channel of the semiconductor device, which reduces the on-state current (and thereby the temperature or heating) at that location relative to the remaining area of the channel that is not overlapped by the throttling region. Thus, the length of the throttling region that overlaps the channel dictates or otherwise influences the overall threshold voltage associated with the gate structure and, hence, the temperature. In this regard, increasing the overlapping area of the throttling region increases the threshold voltage of the gate structure throughout corresponding area of the device, and conversely, decreasing area of the throttling region decreases the threshold voltage of the gate structure throughout that corresponding area. Thus, the overall threshold voltage associated with the gate structure is correlative to the overlapping area of the throttling region, and the threshold voltage may be nonuniform across both the length and the width of the gate structure. In exemplary embodiments, the throttling region has the same conductivity as the underlying body well region; however, in alternative embodiments, the conductivity of the throttling region may be opposite that of the underlying body well region but with a dopant concentration of the throttling region being less than surrounding portions of the gate structure. In other words, the doping of the throttling region is different from remaining portions of the gate structure to increase the threshold voltage and reduce the underlying current, and thereby the temperature, in the portion of the substrate corresponding to the throttling region.

For purposes of explanation, the subject matter is described herein in the context of a multi-gate transistor device that includes a plurality of gate structures distributed across a portion of a semiconductor substrate (or die), with the gate structures being electrically connected to one another at a common node or terminal, such that each of the gate structures has the same electrical potential. As described in greater detail below, in practice, heat transfer (or heat dissipation) is typically more efficient at or near the edges of devices. Advantageously, to reduce the heating at the interior of a device relative to its periphery, doped portions may be provided that overlap interior portions of the respective conductive channels of the respective gate structures, with the overlapping area of the doped portions of the interior gate structures being greater than the overlapping area of the peripheral gate structures. In this manner, the threshold voltages associated with the peripheral gate structures may be less than the threshold voltages associated with the interior gate structures. As a result, the amount of gate overdrive is greater for the peripheral gate structures relative to the interior gate structures. However, the increase in on-state current underlying the peripheral gate structures relative to the on-state current underlying the interior gate structures is offset by the ability of the peripheral gate structures to dissipate heat more effectively than the interior gate structures. Thus, nonuniform threshold voltages across the gate structures of the multi-gate transistor device may be tuned to achieve a more uniform temperature distribution across the multi-gate transistor device.

Figure 1:
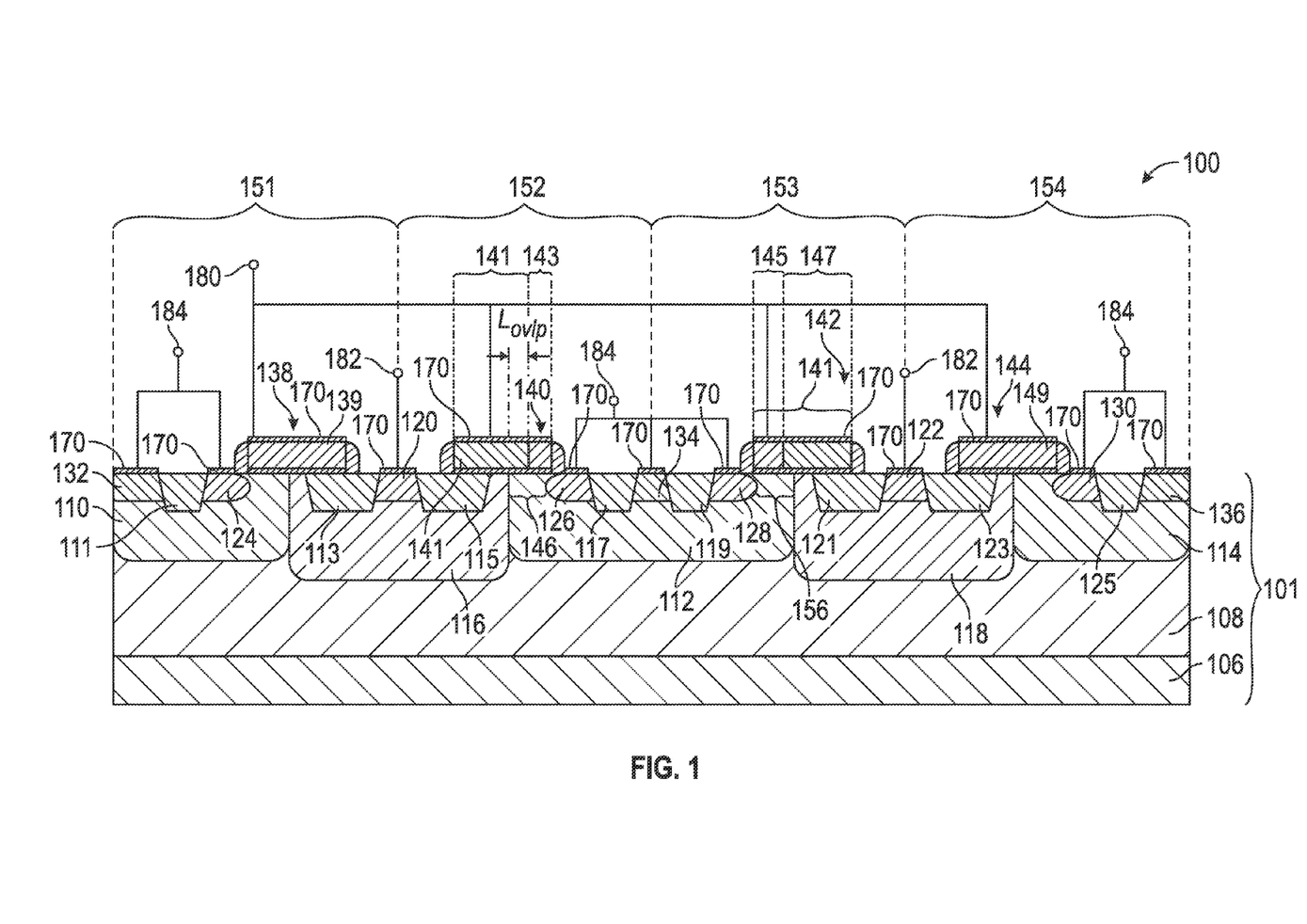
FIG. 1 illustrates, in cross section, an exemplary semiconductor device structure in accordance with one or more embodiments of the invention.
Figure 2:
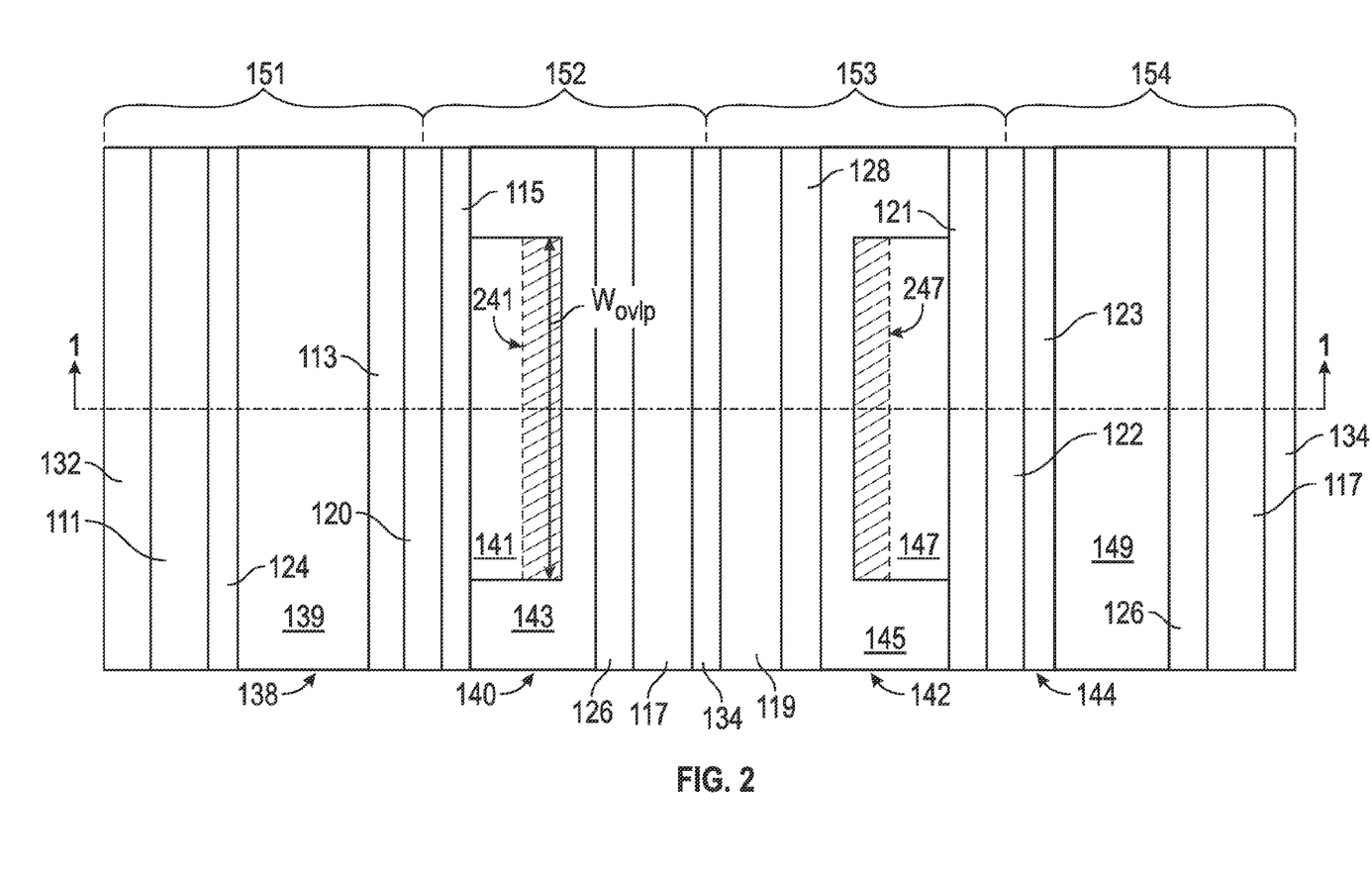

FIGS. 1-2 depict an exemplary semiconductor device structure 100 in accordance with one or more embodiments of the present invention. In exemplary embodiments, the semiconductor device structure 100 includes one or more laterally diffused metal oxide semiconductor (LDMOS) field-effect transistor structures that are fabricated on a semiconductor substrate 101. For purposes of explanation, the illustrated embodiment of FIG. 1 depicts a LDMOS device structure that includes a plurality of LDMOS transistor structures 151, 152, 153, 154. It should be appreciated that FIG. 1 is a simplified representation of the LDMOS device structure 100 for purposes of explanation, and practical embodiments of the LDMOS device structure 100 may include a greater or fewer number of LDMOS transistor structures to achieve the desired power handling capability of a particular application. Furthermore, it should be appreciated that although the subject matter may be described herein in the context of an N-type (or N-channel) device, the subject matter is not intended to be limited to N-type devices and may be implemented in an equivalent manner for a P-type (or P– channel) device (e.g., by interchanging the conductivities of the doped regions).

As described in greater detail below, in exemplary embodiments, the LDMOS transistor structures 151, 152, 153, 154 are configured electrically in parallel to one another, however, the threshold voltages of the LDMOS transistor structures 151, 152, 153, 154 are not uniform across the LDMOS device structure 100. In the illustrated embodiment, the interior LDMOS transistor structures 152, 153 have respective threshold voltages associated therewith that are greater than the respective threshold voltages associated with the peripheral LDMOS transistor structures 151, 154. As a result, the on-state (or drain-to-source) current ($I_{DS}$) through the interior LDMOS transistor structures 152, 153 is less than the on-state current through the peripheral LDMOS transistor structures 151, 154 by reducing the overdrive voltage (or the amount of gate overdrive) for the interior LDMOS transistor structures 152, 153. Because heat may be transferred from the LDMOS device structure 100 more efficiently at or near the periphery of the LDMOS device structure 100, a more uniform temperature distribution across the LDMOS device structure 100 may be achieved. As a result, the thermal safe operating area of the LDMOS device structure 100 may be improved relative to a corresponding structure having substantially uniform threshold voltage across the constituent LDMOS transistors.

In the illustrated embodiment, the first LDMOS transistor structure 151 includes a first drain region 120, a first drift region 116, a first body well region 110, a first source region 124 and a first gate structure 138. The second LDMOS transistor structure 152 includes the first drain region 120, the first drift region 116, a second body well region 112, a second source region 126 and a second gate structure 140. The third LDMOS transistor structure 153 includes a second drain region 122, a second drift region 118, the second body well region 112, a third source region 128 and a third gate structure 142. The fourth LDMOS transistor structure 152 includes the second drain region 122, the second drift region 118, a third body well region 114, a fourth source region 130 and a fourth gate structure 144. In exemplary embodiments, the LDMOS transistor structures 151, 152, 153, 154 are configured electrically in parallel to one another, for example, by providing a first electrical interconnection among drain regions 120, 122, a second electrical interconnection among the source regions 124, 126, 128, 130, a third electrical interconnection among body well regions 110, 112, 114 (e.g., via body contact regions 132, 134, 136), and a fourth electrical interconnection among the gate structures 138, 140, 142, 144.

To achieve higher threshold voltages for the interior LDMOS transistor structures 152, 153, throttling portions 141, 147 of the interior gate structures 140, 142 have the same conductivity as the underlying body well region 112 and overlap at least a portion of the respective channel portions of the body well region 112. The threshold voltage of a respective LDMOS transistor structures 152, 153 corresponds or is otherwise correlative to the overlapping length 241, 247 of the respective overlapping throttling portion 141, 147. For example, for an N-type LDMOS transistor structure 152, a P-type gate portion 141 overlaps or otherwise overlies at least a portion of the channel portion 146 of the P-type body well region 112 that is adjacent to the N-type drift region 116. The P-type gate portion 141 also overlaps or otherwise overlies the accumulation region of the N-type drift region 116 that resides laterally between the isolation region 115 and the channel portion 146. Increasing the length ($L_{ovlp}$) by which the P-type gate portion 141 extends laterally beyond the boundary of the channel portion 146 with the drift region 116 increases the threshold voltage of the LDMOS transistor structure 152. Additionally, as illustrated in FIG. 2, increasing the width ($W_{ovlp}$) of the overlapping portion of the P-type gate portion 141 also increases the threshold voltage of the LDMOS transistor structure 152. Although FIGS. 1-2 depict the length of the P-type gate portion 141 being less than the length of the gate structure 140, in some embodiments, the P-type gate portion 141 may have the same length as the gate structure 140 but a width that is less than the width of the gate structure 140. Similarly, although FIGS. 1-2 depict the width of the P-type gate portion 141 being less than the width of the gate structure 140, in some embodiments, the P-type gate portion 141 may have the same width as the gate structure 140 but a length that is less than the length of the gate structure 140.

The overlapping area 241 defined by the length and width of the overlapping portion of the P-type gate portion 141 (e.g., $L_{ovlp} \times W_{ovlp}$) changes the work function of the gate structure 140 by decreasing the percentage of the channel portion 146 that has an N-type gate portion 143 overlying it and reducing the on-state current through the portions of the channel portion 146 that underlie the P-type gate portion 141. Thus, the amount of overlapping area 241 of the P-type gate portion 141 overlying the channel portion 146 dictates the threshold voltage of the LDMOS transistor structure 152 relative to the same structure having a uniformly doped gate structure of the opposite conductivity to the underlying body (e.g., a peripheral LDMOS structure 151, 154). In this regard, the threshold voltage of the LDMOS transistor structure 152 may be tuned to a desired voltage by adjusting either or both of the length ($L_{ovlp}$) and width ($W_{ovlp}$) of the overlapping area 241 of the P-type gate portion 141 to achieve a desired level of on-state current through the underlying channel portion 146 of the LDMOS transistor structure 152.

In a similar manner, the length and width of the overlapping area 247 of the P-type gate portion 147 may be chosen to achieve a desired level of on-state current through the underlying channel portion 156 of the LDMOS transistor structure 153 that is overlapped by the area 247. In this regard, although FIGS. 1-2 depict the overlapping area 247 of the P-type gate portion 142 having the same overlapping length and overlapping width as the overlapping area 241 of the P-type gate portion 141, in various embodiments, the length or the width (or both) of the overlapping area 247 may be different than that of the overlapping area 241. To put it another way, the overlapping area 247 may be greater than (e.g., to achieve a higher threshold voltage) or less than (e.g., to achieve a lower threshold voltage) the overlapping area 241. In this manner, the threshold voltage of each of the LDMOS transistor structures 151, 152, 153, 154 may be uniquely tuned as desired to achieve a desired on-state current at various locations across the LDMOS device structure 100 and thereby achieve a more uniform temperature distribution across the LDMOS device structure 100.

Fabrication of the LDMOS device structure 100 will now be described with continued reference to FIGS. 1-2. Various steps in the manufacture of MOS devices are well known and so, in the interest of brevity, many conventional steps will only be mentioned briefly herein or will be omitted entirely without providing the well-known process details.

Moreover, although the subject matter is described herein in the context of forming the LDMOS transistor in epitaxial silicon on a silicon substrate, the subject matter is not limited to epitaxial silicon or a silicon substrate and an equivalent LDMOS transistor structure may be fabricated on any suitable substrate of bulk semiconductor material, a silicon-on-insulator (SOI) substrate, or other non-epitaxial semiconductor material in an appropriate manner.

Fabrication of the semiconductor device structure 100 begins by obtaining a substrate 101 having an epitaxial layer 108 of semiconductor material, which may be formed on or overlying another layer 106 of semiconductor material. In an exemplary embodiment, the semiconductor material of layer 106 is realized as a silicon material, wherein the term "silicon material" is used herein to encompass the relatively pure silicon materials typically used in the semiconductor industry as well as silicon admixed with other elements such as germanium, carbon, and the like. Alternatively, the layer 106 may be realized as germanium, gallium arsenide, and the like, or the layer 106 may include layers of different semiconductor materials. In exemplary embodiments, the layer 106 is lightly doped. For example, for an N-type device, the layer 106 may be realized as a P-type silicon material having a P-type dopant concentration (e.g., boron ions or a boron ionized species) in the range of about $1\times10^{13}/cm^3$ to about $1\times10^{17}/cm^3$. Again, it should be understood that the fabrication process described herein is not constrained by the substrate of semiconductor material utilized, and the fabrication process described herein may also be used to create devices from a SOI substrate.

The fabrication process continues by forming or otherwise providing an epitaxial layer 108 of semiconductor material on the seed layer 106 to provide an active region of semiconductor material having a desired thickness and conductivity. For example, for an N-type device, the epitaxial layer 108 may be formed by epitaxially growing silicon material on the seed layer 106 and in-situ doping the silicon material by adding boron ions (or other P-type ions) to the reactants used to epitaxially grow the layer 108. In one or more embodiments, for an N-type device, the epitaxial layer 108 has a P-type dopant concentration (e.g., boron ions or a boron ionized species) in the range of about $1\times10^{13}/cm^3$ to about $1\times10^{15}/cm^3$. In some embodiments, the dopant concentration of the epitaxial layer 108 is substantially equal to the dopant concentration of the seed layer 106 (e.g., on the same order of magnitude). The epitaxial layer 108 may be grown to a thickness such that a total thickness of the active region (e.g., the sum of the thickness of the seed layer 106 and the epitaxial layer 108) is in the range of about one micron (or micrometers) to about 10 microns. It will be appreciated that the total thickness of the active region may vary depending on the needs of a particular application. After forming the epitaxial layer 108, the fabrication process continues by forming shallow isolation regions 111, 113, 115, 117, 119, 121, 123, 125 of a dielectric material in the epitaxial layer 108 by performing shallow trench isolation (STI). In exemplary embodiments, the depth of the shallow isolation regions 111, 113, 115, 117, 119, 121, 123, 125 is less than the depth (or thickness) of the subsequently-formed drift regions 116, 118 and body well regions 110, 112, 114.

In the illustrated embodiment, body well regions 110, 112, 114 of semiconductor material which are more heavily doped than the epitaxial layer 108 are formed within the epitaxial layer 108. In this regard, the substrate 101 is masked with an implantation mask patterned to expose portions of the substrate 101 to be used for the body well regions 110, 112, 114 while masking portions of the substrate 101 to be used for the drift regions 116, 118. P-type body well regions 110, 112, 114 are formed by implanting P-type ions in the exposed epitaxial layer 108 with a dopant concentration that is greater than the dopant concentration of the epitaxial layer 108. For example, in accordance with one embodiment, P-type body well regions 110, 112, 114 are formed by implanting P-type ions with a dopant concentration in the range of about $1\times10^{16}/cm^3$ to about $1\times10^{17}/cm^3$ in a series of one or more implants to provide body well regions 110, 112, 114 having a depth in the range of about 0.5 micron to about 3.0 microns relative to the surface of the substrate 101. In one or more embodiments, the dopant concentration of the P-type body well regions 110, 112, 114 is greater than $1\times10^{17}/cm^3$.

Either before or after forming the body well regions 110, 112, 114, drift regions 116, 118 of semiconductor material having the opposite conductivity of the body well regions 110, 112, 114 are formed in the substrate 101. The drift regions 116, 118 function as lateral drift regions between a drain electrode and a conductive channel of a respective transistor structure 151, 152, 153, 154. As used herein, a "drift region" should be understood as referring to a doped region of semiconductor material between a relatively higher doped drain region (or drain electrode contact region) and a channel region of a transistor. The drift region supports the voltage bias at the drain region by distributing or otherwise dissipating the voltage (or electrical potential) of the drain region throughout the drift region. The drift region also provides a conductive path for current between the channel region and the drain region.

Figure 3:
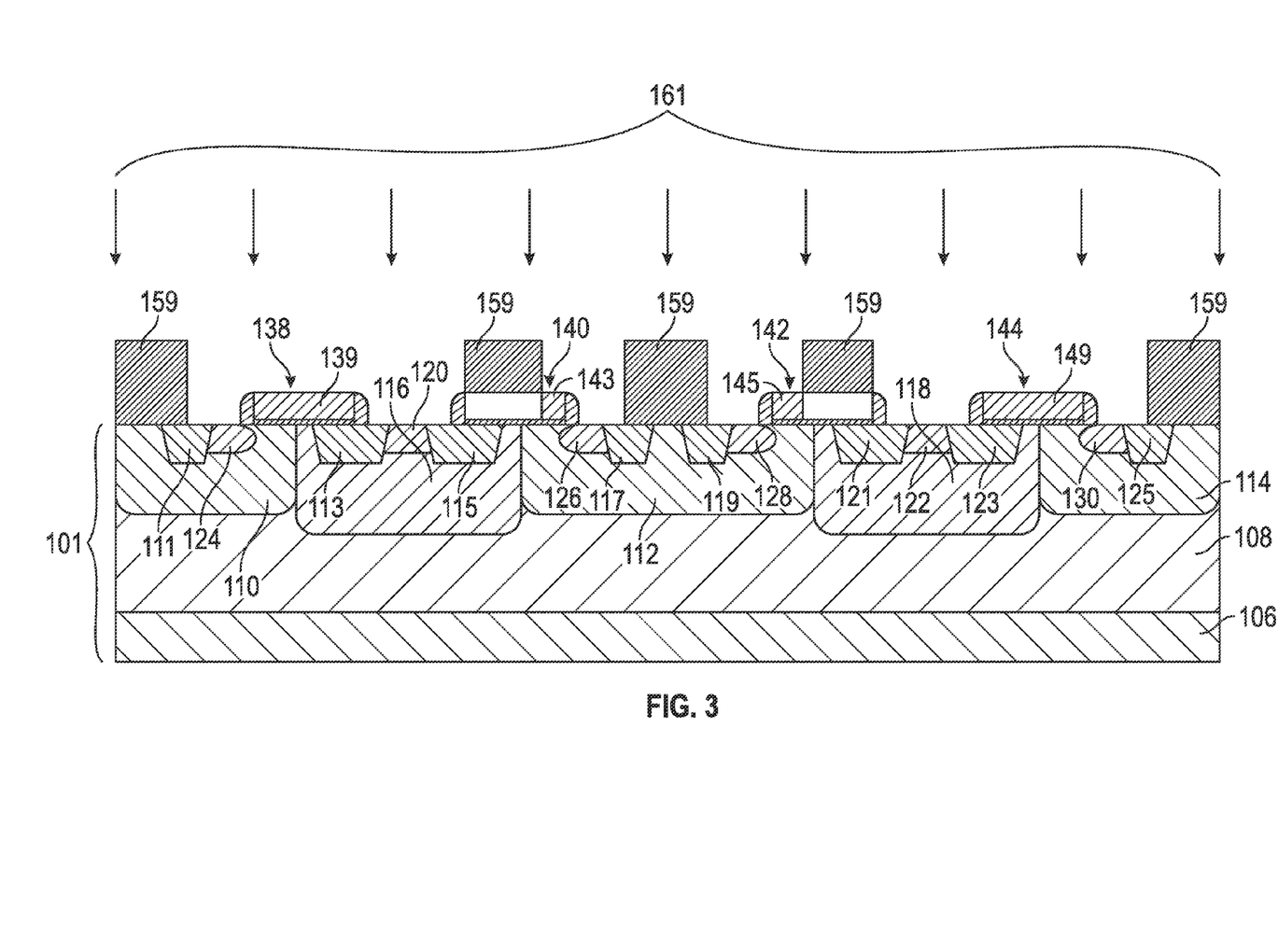
FIGS. 3-4 illustrate, in cross section, exemplary methods for fabricating the semiconductor device of FIGS. 1-2 in accordance with one or more embodiments of the invention.
Figure 4:
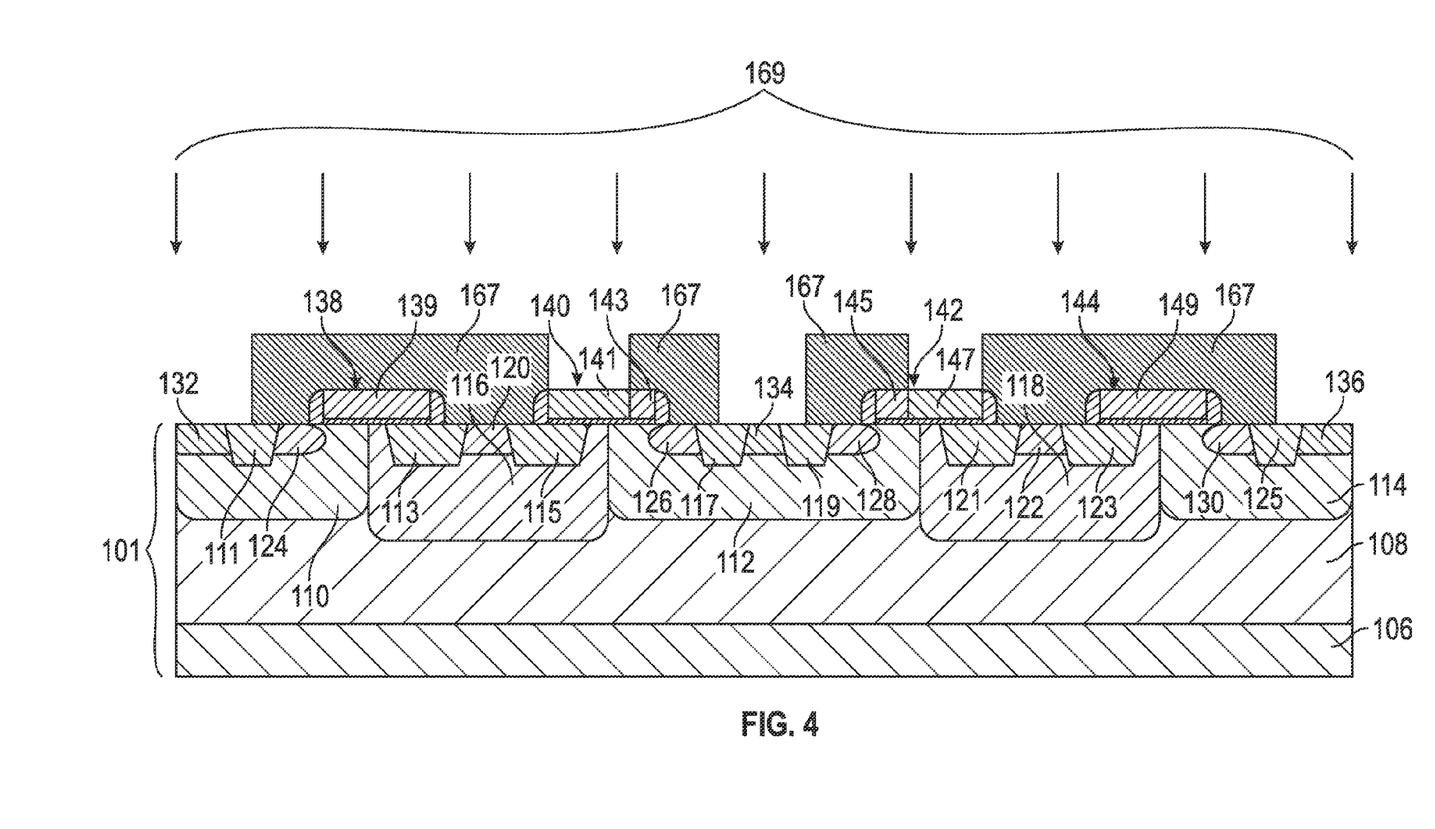

In a similar manner as described above for the body well regions 110, 112, 114, the drift regions 116, 118 are formed by masking the substrate 101 with an implantation mask patterned to expose portions of the substrate 101 to be used for the drift regions 116, 118 while masking the body well regions 110, 112, 114. For exemplary embodiments described herein, N-type lateral drift regions 116, 118 are then formed by implanting N-type ions with a dopant concentration in the range of about $1\times10^{15}/cm^3$ to about $1\times10^{16}/cm^3$ (typically about $2\times10^{16}/cm^3$) in a series of one or more implants to provide the lateral drift regions 116, 118 having a depth in the range of about 0.5 microns to about 3.0 microns relative to the surface of the substrate 101. It should be noted that although FIGS. 1 and 3-4 depict substantially uniform lateral drift regions 116, 118, in alternative embodiments, the drift regions may be comprised of multiple different dopant implant profiles having varying depths and/or dopant concentrations. In one or more embodiments, the dopant concentration of the drift regions 116, 118 is greater than the dopant concentration of the epitaxial layer 108 but less than the dopant concentration of the body well regions 110, 112, 114.

After forming the body well regions 110, 112, 114 and drift regions 116, 118, fabrication continues by forming the gate structures 138, 140, 142, 144 overlying the semiconductor substrate 101. Each of the gate structures 138, 140, 142, 144 overlies a vertical p-n junction between a lateral drift region 116, 118 and a bordering body well region 110, 112, 114, and each of the illustrated gate structures 138, 140, 142, 144 extends laterally to overlie the respective isolation region 113, 115, 121, 123 that resides laterally between a respective body well region 110, 112, 114 and a respective drain region 120, 122. In this regard, the first gate structure 138 is formed overlying a channel portion of the P-type body well region 110, an adjacent portion of the N-type drift region 116 and a portion of the isolation region 113 between the subsequently-formed drain region 120 and the P-type body well region 110. The second gate structure 140 is formed overlying the first channel portion 146 of the P-type body well region 112, an adjacent portion of the N-type drift region 116 and a portion of the isolation region 115 between the subsequently-formed drain region 120 and the P-type body well region 112. The third gate structure 142 is formed overlying the second channel portion 156 of the P-type body well region 112, an adjacent portion of the N-type drift region 118 and a portion of the isolation region 121 between the subsequently-formed drain region 122 and the P-type body well region 112. The fourth gate structure 144 is formed overlying a channel portion of the P-type body well region 114, an adjacent portion of the N-type drift region 116 and a portion of the isolation region 123 between the subsequently-formed drain region 122 and the P-type body well region 114.

In exemplary embodiments, the gate structures 138, 140, 142, 144 are formed by forming one or more layers of dielectric material overlying the semiconductor substrate 101, forming one or more layers of conductive (or semi-conductive) material overlying the dielectric material, and etching the layers of materials to define the gate structures 138, 140, 142, 144. In this regard, the conductive material functions as the conductive gate electrode material of the gate structures 138, 140, 142, 144 and the underlying portion of dielectric material functions as the gate insulator. In accordance with one or more embodiments, the dielectric material is realized as an oxide material that is formed by oxidizing the exposed surfaces of the substrate 101 to a thickness of about 7 nanometers (nm) to about 35 nm. After the dielectric material is formed, the conductive material may be formed by conformably depositing a conductive material, such as a polycrystalline silicon material, by chemical vapor deposition (CVD) or another suitable deposition process to a thickness of about 60 nm to about 350 nm. After the conductive material is formed, fabrication of the gate structures 138, 140, 142, 144 may be completed by masking the portions of the gate materials to be utilized for the gate structures 138, 140, 142, 144 and etching the exposed portions of the gate materials using an anisotropic etchant. Sidewall spacers may also be formed about the sidewalls of the gate structures 138, 140, 142, 144 in a conventional manner.

Referring now to FIGS. 3-4, after forming gate structures 138, 140, 142, 144, fabrication of the semiconductor device structure 100 continues by forming doped electrode contact regions 120, 122, 124, 126, 128, 130, 132, 134, 136. The electrode contact regions are relatively heavily doped such that they have low resistivity. In exemplary embodiments, concurrently to forming the doped electrode contact regions, portions of the gate structures 138, 140, 142, 144 are doped in a desired manner to achieve a desired area of P-type conductive gate material overlapping a P-type channel region for the respective transistor structures 151, 152, 153, 154. For example, referring to FIG. 3, in exemplary embodiments, N-type portions 139, 143, 145, 149 of conductive gate electrode material are formed concurrently to forming drain contact regions 120, 122 in the lateral drift regions 116, 118 and source contact regions 124, 126, 128, 130 in the body well regions 110, 112, 114 proximate the gate electrode structures 138, 140, 142, 144. In this regard, the dopant concentration of the N-type portions 139, 143, 145, 149 of conductive gate electrode material may be substantially equal to the dopant concentration of the source/drain regions 120, 122, 124, 126, 128, 130.

As illustrated in FIG. 3, in an exemplary embodiment, the semiconductor device structure 100 is masked with an implantation mask 159 that exposes portions of the body well regions 110, 112, 114 proximate the gate structures 138, 140, 142, 144 and interior portions of the drift regions 116, 118. The mask 159 also masks portions of the interior gate structures 140, 142 to be used for the P-type gate portions 141, 147 while exposing the surrounding portions 143, 145 of the interior gate structures 140, 142 and the peripheral gate structures 138, 144. The drain/source contact regions 120, 122, 124, 126, 128, 130 and the N-type portions 139, 143, 145, 149 of gate electrode material are then formed by implanting ions of the same conductivity-determining impurity type as the drift regions 116, 118, illustrated by arrows 161, in the exposed portions of the body well regions 110, 112, 114, exposed portions of the gate structures 138, 140, 142, 144, and exposed portions of the drift regions 116, 118 using the implantation mask 159, resulting in the semiconductor device structure 100 of FIG. 3. For example, for an N-channel semiconductor device, N-type ions, such as phosphorous ions or a phosphorous ionized species, may be implanted with a dopant concentration in the range of about $1\times10^{19}/cm^3$ to about $1\times10^{21}/cm^3$. The ion implantation energy level used for the drain/source contact regions 120, 122, 124, 126, 128, 130 is less than the ion implantation energy level used for the body well regions 110, 112, 114 and the drift regions 116, 118 such that the depth of the source regions 124, 126, 128, 130 is less than the depth of the body well regions 110, 112, 114. The depth of the drain regions 120, 122 is also less than the depth of the isolation regions 113, 115, 121, 123. In one embodiment, N-type ions are implanted with a dopant concentration of about $1\times10^{21}/cm^3$ at an energy level of about 30 keV to provide drain/source contact regions 120, 122, 124, 126, 128, 130 having a depth of about 100 nm relative to the surface of the substrate 101. It will be appreciated that the source contact regions 124, 126, 128, 130 function as the source (or source region) for the respective LDMOS transistor structures 151, 152, 153, 154, whereas the drain contact regions 120, 122 function as the drain (or drain region) for the respective LDMOS transistor structures 151, 152, 153, 154. It should be noted that in alternative embodiments, the drain/source contact regions 120, 122, 124, 126, 128, 130 may be formed with separate ion implantations steps and/or differing dopant concentrations. For example, laterally diffused source extension regions may be formed to extend further underneath the gate structures 138, 140, 142, 144 prior to forming the source regions 124, 126, 128, 130.

Turning now to FIG. 4, after forming the drain/source contact regions 120, 122, 124, 126, 128, 130 and the N-type gate portions 139, 143, 145, 149, the fabrication process continues by removing the implantation mask 159 and forming body contact regions 132, 134, 136 in the body well regions 110, 112, 114 while concurrently forming P-type throttling portions 141, 147 of conductive gate electrode material. The semiconductor device structure 100 is masked with an implantation mask 167 that masks the N-type portions 139, 143, 145, 149 of the gate structures 138, 140, 142, 144 and the drain/source contact regions 120, 122, 124, 126, 128, 130 and leaves exposed the portions of the body well regions 110, 112, 114 and the remaining undoped portions of the gate structures 138, 140, 142, 144. The body contact regions 132, 134, 136 and P-type gate portions 141, 147 are formed by implanting ions of the same conductivity-determining impurity type as the body well regions 110, 112, 114, illustrated by arrows 169, in the exposed portions of the body well regions 110, 112, 114 and the gate structures 140, 142 using the implantation mask 169. For example, in accordance with one embodiment, P-type ions, such as boron ions or a boron ionized species, are implanted with a dopant concentration in the range of about $1\times10^{19}$/cm$^3$ to about $1\times10^{21}$/cm$^3$ at an energy level in the range of about 2 keV to about 15 keV. In this regard, the dopant concentration of the body contact regions 132, 134, 136 is greater than the dopant concentration of the body well regions 110, 112, 114 but the ion implantation energy level used for the body contact regions 132, 134, 136 is less than the ion implantation energy level used for the body well regions 110, 112, 114 such that the depth of the body contact regions 132, 134, 136 is less than the depth of the body well regions 110, 112, 114. For example, in one embodiment, boron ions or a boron ionized species are implanted with a dopant concentration of about $1\times10^{21}$/cm$^3$ at an energy level of about 5 keV to provide body contact regions 132, 134, 136 having a depth of about 100 nm relative to the surface of the substrate 101. In this regard, the depth and dopant concentration of the body contact regions 132, 134, 136 may be substantially same as the depth and dopant concentration of the drain/source contact regions 120, 122, 124, 126, 128, 130 but with the opposite conductivity.

After the electrode contact regions 120, 122, 124, 126, 128, 130, 132, 134, 136 and doped gate portions 139, 141, 143, 145, 147, 149 are formed, fabrication of the semiconductor device structure 100 device continues by removing the implantation mask 167 and forming contacts 170 overlying the contact regions 120, 122, 124, 126, 128, 130, 132, 134, 136 and the gate structures 138, 140, 142, 144. For example, the contacts 170 may be realized as silicide contacts that are formed in a conventional manner. Thereafter, fabrication may be completed by performing any number of back end of line (BEOL) process steps to forming appropriate electrical interfaces and/or electrical connections to/from the silicide contacts, for example, using subsequently formed interconnect layers overlying the semiconductor device structure 100. As described above, in exemplary embodiments, the gate structures 138, 140, 142, 144 are electrically connected (or shorted to one another) at a gate terminal 180 (or node, pin, port, or other suitable electrical interface) via one or more conductive connections between the gate contacts so that the gate structures 138, 140, 142, 144 have the same voltage (or electrical potential). Similarly, the drain regions 120, 122 are electrically connected (or shorted to one another) at a drain terminal 182, and the source regions 124, 126, 128, 130 are electrically connected (or shorted to one another) at a source terminal 184. Additionally, the body contact regions 132, 134, 136 may be electrically connected to the source regions 124, 126, 128, 130 (or the source terminal 184) so that the source and body of the multi-gate LDMOS device structure 100 have the same voltage (or electrical potential).

Figure 5:
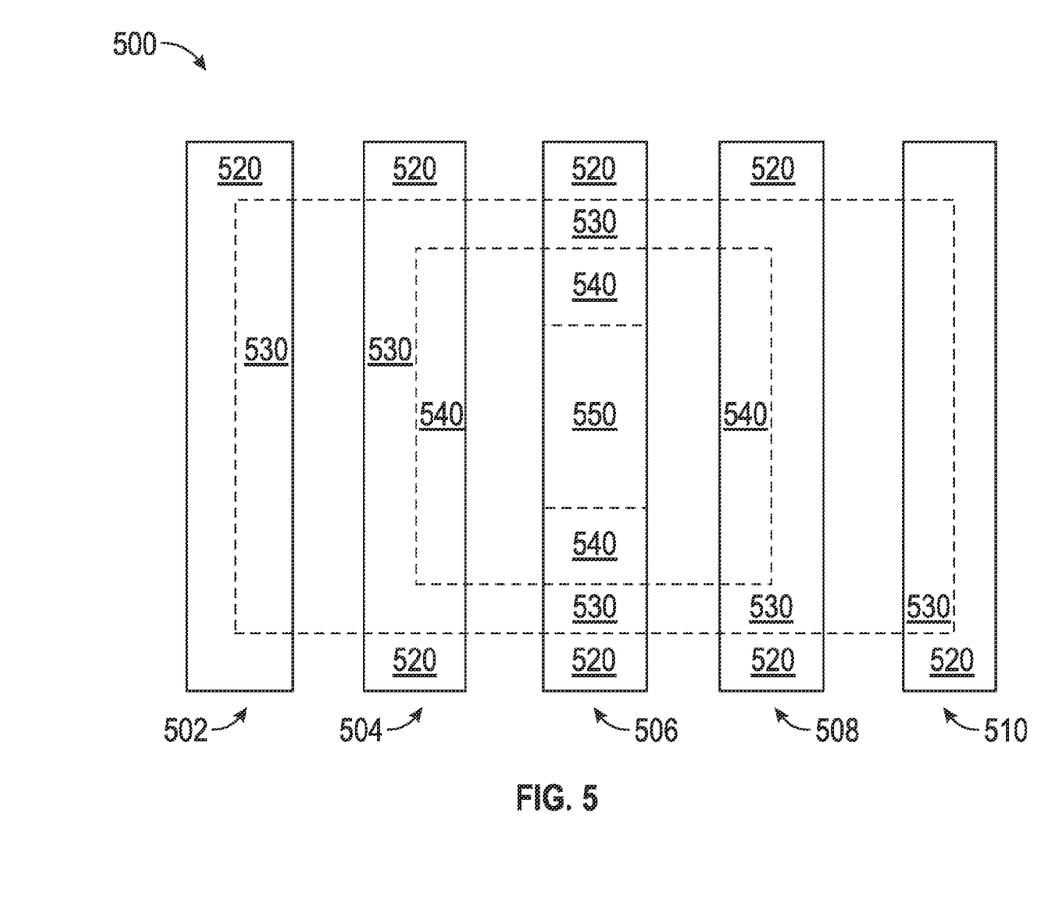
FIG. 5 depicts a top view of a semiconductor device structure in accordance with one or more alternative embodiments of the invention.

FIG. 5 depicts a simplified representation of a top view of a multi-gate semiconductor device structure 500 illustrating how different dopant profiles may be graded across a semiconductor device structure using different ion implantations process steps to achieve a more uniform temperature distribution or otherwise achieve a desired thermal safe operating area. In this regard, FIG. 5 depicts progressively doping the gate structures 502, 504, 506, 508, 510 in a manner that decreases the current at or near the center of the multi-gate LDMOS semiconductor device structure 500 (or alternatively, increases the current at or near the edges of the structure 500 relative to the center of the structure 500). In the illustrated embodiment, each of the gate structures 502, 504, 506, 508, 510 includes one or more portions 520 of conductive gate electrode material having the same conductivity type as the drain regions of the multi-gate LDMOS semiconductor device structure 500. For example, for an N-type LDMOS structure 500 such as the one described above in the context of FIGS. 1-4, N+ conductive gate portions 520 may be doped concurrently to forming the drain contact regions in the semiconductor device structure 500. In the illustrated embodiment, each of the gate structures 502, 504, 506, 508, 510 also include one or more portions 530 of conductive gate electrode material having a dopant concentration or conductivity type that reduces or otherwise discourages the on-state current flowing through the respective underlying channel portions. For example, conductive gate portions 530 may be more lightly doped with the same conductivity as the drain regions (e.g., to provide N– gate portions 530), or alternatively, the conductive gate portions 530 may be lightly doped with the same conductivity as the underlying body well regions (e.g., to provide P– gate portions 530). In this manner, the threshold voltages of the peripheral gate structures 502, 510 are increased for the areas corresponding to where the respective inner gate portions 530 overlap the respective underlying body well regions relative to the threshold voltages for the areas where the remaining N+ gate portions 520 overlap the underlying body well regions. Thus, increased on-state current flows underlying the peripheral portions 520 of the gate structures 502, 510 relative to the on-state current flowing underneath the inner portions 530 of the gate structures 502, 510.

In the illustrated embodiment, the inner gate structures 504, 506, 508 include one or more additional portions 540 of conductive gate electrode material having doping characteristics that further reduce or discourage the underlying on-state current. For example in the case of N– gate portions 530, conductive gate portions 540 may be lightly doped with the same conductivity as the underlying body well regions (e.g., to provide P– gate portions 540). Or alternatively, in the case of P– gate portions 530, conductive gate portions 540 may be more doped with the same conductivity as the underlying body well regions (e.g., to provide P-type gate portions 540). In this manner, the threshold voltages of the innermost portions 540 of the intermediate gate structures 504, 508 are increased relative to the surrounding portions 530 of the intermediate gate structures 504, 508, which, in turn, have increased threshold voltages relative to the edge portions 520 of the intermediate gate structures 504, 508. Thus, the on-state current flowing underneath the intermediate gate structures 504, 508 progressively increases towards the edges of the device structure 500 (or conversely, the threshold voltage progressively increases towards the center of the device structure 500).

As illustrated, the central gate structure 550 may include an additional portion 550 of conductive gate electrode material having doping characteristics that further reduces or discourages the underlying on-state current. For example, a P+ central gate portion 550 may be formed concurrently to forming the body contact regions of the device structure 500. In this manner, the threshold voltage of the central portion 550 of the central gate structure 550 is increased relative to the adjacent portions 540, which, in turn, have increased threshold voltages relative to their outwardly adjacent portions 530, which, in turn, have increased threshold voltages relative to their adjacent edge portions 520. Thus, the on-state current flowing underneath the central gate structure 506 progressively increases towards the edge of the device structure 500 (or conversely, the threshold voltage progressively increases towards the center of the device structure 500), thereby reducing the temperature at the center of the semiconductor device structure 500 to achieve a more uniform temperature distribution or otherwise improve the thermal safe operating area.

It should be appreciated that FIG. 5 is a simplified representation provided for purposes of explanation and is not intended to be limiting. In this regard, any number of different implantation process steps may be performed to achieve a desired current distribution (and thereby, temperature distribution) by grading or otherwise varying the doping across the semiconductor device structure 500. That said, as described above in the context of FIGS. 1-4, additional ion implantation process steps are not necessarily required to achieve a desired current or temperature distribution, and existing ion implantation process steps may be utilized to concurrently dope the gate structures with the appropriate patterning to produce the same effect.

It should be noted that different dopant profiles may also be graded across a semiconductor device structure by varying the overlapping length and area of the throttling portions of the respective gate structures. For example, throttling portions of interior gate structures may have overlapping lengths and areas in the direction of current flow that are greater than those of the throttling portions of intermediate gate structures, which, in turn, have overlapping lengths and areas that are greater than those of the throttling portions of outermost (or edge) gate structures. Thus, a desired current distribution (and thereby, temperature distribution) can be achieved by varying (or tuning) the doping across the gate structures of a semiconductor device in conjunction with varying (or tuning) the overlapping dimensions of the throttling portions of the respective gate structures.

To briefly summarize, the subject matter described herein enables improving the thermal safe operating area of a device without changing the physical layout or material composition of the device, and additionally, may be achieved without any additional fabrication process steps. As described above, the doping of the gate structures may be adjusted or otherwise varied across the device to increase the threshold voltage (and decrease the gate overdrive) at locations that could otherwise be hot spots of the device and reduce the on-state current and the corresponding temperature at those locations, thereby improving the thermal safe operating area. For example, in one embodiment, a 10% reduction in current ($I_{ds}$) underlying the central gate structures of a 40-gate NLDMOS with a gate length of 1 micron and a gate width of 50 microns at a gate bias of 5 Volts is achieved by providing throttling portions having an overlapping length of 0.4 microns, an overlapping width of 25 microns, and dopant concentration of $4 \times 10^{20}/cm^3$. Additionally, the threshold voltage may be increased in a manner that does not significantly increase on-state resistance (e.g., by 10% or less). Increasing the threshold voltage and thermal safe operating area also improves the robustness or resiliency of the device with respect to electrostatic discharge (ESD) events.

For the sake of brevity, conventional techniques related to semiconductor and/or integrated circuit fabrication, power transistors, biasing, device breakdown, and other functional aspects of the subject matter may not be described in detail herein. In addition, certain terminology may also be used herein for the purpose of reference only, and thus are not intended to be limiting. For example, the terms "first", "second" and other such numerical terms referring to structures do not imply a sequence or order unless clearly indicated by the context.

The foregoing detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the foregoing detailed description.

In conclusion, devices and methods configured in accordance with example embodiments of the invention relate to:

An apparatus for a semiconductor device structure is provided in one embodiment. The semiconductor device structure comprises a body well region of semiconductor material having a first conductivity type, a drift region of semiconductor material having a second conductivity type, a source region of semiconductor material having the second conductivity type, a channel portion of the body well region residing laterally between the source region and a first portion of the drift region, the first portion being adjacent to the channel portion, and a gate structure overlying at least the channel portion of the body well region and the first portion of the drift region. A second portion of the gate structure overlying the channel portion proximate the source region has the second conductivity type, a throttling portion of the gate structure overlies the first portion of the drift region and at least a portion of the channel portion, and a doping of the throttling portion is different from the second portion of the gate structure. The threshold voltage associated with the gate structure is influenced by the throttling portion overlapping the channel portion. In one or more embodiments, the width of an area of the throttling portion that overlaps the channel portion is less than a width of the gate structure, and a length of the area of the throttling portion that overlaps the channel portion is less than a length of the gate structure. In one embodiment, a dopant concentration of the body well region is greater than $1 \times 10^{16}/cm^3$, and a dopant concentration of the drift region is less than $1 \times 10^{17}/cm^3$. In another embodiment, semiconductor device structure further comprises an epitaxial region of semiconductor material having the first conductivity type, wherein the epitaxial region underlies the body well region and the drift region and a dopant concentration of the epitaxial region is less than a dopant concentration of the body well region. In another embodiment, the semiconductor device structure further comprises a drain region of semiconductor material within the drift region, the drain region having the second conductivity type, wherein a dopant concentration of the drain region is greater than a dopant concentration of the drift region and the first portion of the drift region resides laterally between the drain region and the channel portion. In one embodiment, the semiconductor device structure further comprises an isolation region of dielectric material, the isolation region residing laterally between the drain region and the first portion of the drift region, wherein the throttling portion of the gate structure overlies at least a portion of the isolation region. In another embodiment, the threshold voltage is nonuniform with respect to a width of the gate structure. In yet another embodiment, a width of the area of the throttling portion varies along a length of the gate structure. In yet another embodiment, a length of an area of the throttling portion that overlaps the channel portion varies along a width of the gate structure.

Another embodiment of a semiconductor device structure comprises a plurality of body well regions of semiconductor material having a first conductivity type, a plurality of drift regions of semiconductor material having a second conductivity type, at least a portion of each drift region being adjacent to a channel portion of at least one body well region of the plurality of body well regions, a plurality of source regions of semiconductor material having the second conductivity type, a channel portion of the at least one body well region residing laterally between a respective source region and a respective drift region of the plurality of drift regions, and a plurality of gate structures, each gate structure overlying at least the channel portion of a respective body well region of the plurality of body well regions. The plurality of gate structures are electrically connected, and a threshold voltage of at least one of the gate structures of the plurality of gate structures is different than the threshold voltage of one or more remaining gate structures of the plurality of gate structures. In one embodiment, the plurality of drift regions are electrically connected and the plurality of source regions are electrically connected. In another embodiment, each respective gate structure includes a layer of a conductive material, and a respective threshold voltage of each respective gate structure corresponds to a respective area of the layer of the conductive material having the first conductivity type that overlies the channel portion of the respective body well region. In one embodiment, a threshold voltage associated with a peripheral gate structure of the plurality of gate structures is less than a threshold voltage associated with an interior gate structure of the plurality of gate structures. In yet another embodiment, a dopant concentration of the body well region is greater than $1 \times 10^{16}/cm^3$.

An exemplary method of fabricating a semiconductor device on a semiconductor substrate is also provided. The method comprises forming a body well region of semiconductor material having a first conductivity type within the semiconductor substrate, forming a drift region of semiconductor material having a second conductivity type within the semiconductor substrate adjacent to a channel portion of the body well region, forming a gate structure overlying the channel portion of the body well region and at least a portion of the drift region, and forming a doped portion of the gate structure having the first conductivity type overlying the portion of the drift region and at least a portion of the channel portion to influence a threshold voltage associated with the gate structure. In one embodiment, forming the doped portion comprises forming the doped portion with a width less than a width of the gate structure. In another embodiment, forming the doped portion comprises forming the doped portion with a length less than a length of the gate structure. In yet another embodiment, forming the doped portion comprises forming the doped portion concurrently to forming a body contact region within the body well region.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A semiconductor device structure comprising:
   a body well region of semiconductor material having a first conductivity type;
   a drift region of semiconductor material having a second conductivity type;
   a source region of semiconductor material having the second conductivity type, a channel portion of the body well region residing laterally between the source region and a first portion of the drift region, the first portion being adjacent to the channel portion; and
   a gate structure overlying at least the channel portion of the body well region and the first portion of the drift region, wherein
      a second portion of the gate structure overlying the channel portion proximate the source region has the second conductivity type,
      a throttling portion of the gate structure overlies the first portion of the drift region and at least a portion of the channel portion,
      a doping of the throttling portion is different from the second portion of the gate structure, and
      a width of an area of the throttling portion that overlaps the channel portion is less than a width of the gate structure.

2. The semiconductor device structure of claim 1, wherein a length of the area of the throttling portion that overlaps the channel portion is less than a length of the gate structure.

3. The semiconductor device structure of claim 1, wherein a dopant concentration of the body well region is greater than $1 \times 10^{16}/cm^3$.

4. The semiconductor device structure of claim 3, wherein a dopant concentration of the drift region is less than $1 \times 10^{17}/cm^3$.

5. The semiconductor device structure of claim 1, further comprising an epitaxial region of semiconductor material having the first conductivity type, wherein:
   the epitaxial region underlies the body well region and the drift region; and
   a dopant concentration of the epitaxial region is less than a dopant concentration of the body well region.

6. The semiconductor device structure of claim 1, further comprising a drain region of semiconductor material within the drift region, the drain region having the second conductivity type, wherein:
   a dopant concentration of the drain region is greater than a dopant concentration of the drift region; and
   the first portion of the drift region resides laterally between the drain region and the channel portion.

7. The semiconductor device structure of claim 6, further comprising an isolation region of dielectric material, the isolation region residing laterally between the drain region and the first portion of the drift region, wherein the throttling portion of the gate structure overlies at least a portion of the isolation region.

8. The semiconductor device structure of claim 1, wherein:
   a threshold voltage associated with the gate structure is influenced by the throttling portion overlapping the channel portion; and
   the threshold voltage is nonuniform with respect to a width of the gate structure.

9. A semiconductor device structure comprising:
   a body well region of semiconductor material having a first conductivity type;
   a drift region of semiconductor material having a second conductivity type;

a source region of semiconductor material having the second conductivity type, a channel portion of the body well region residing laterally between the source region and a first portion of the drift region, the first portion being adjacent to the channel portion; and a gate structure overlying at least the channel portion of the body well region and the first portion of the drift region, wherein
- a second portion of the gate structure overlying the channel portion proximate the source region has the second conductivity type,
- a throttling portion of the gate structure overlies the first portion of the drift region and at least a portion of the channel portion,
- a doping of the throttling portion is different from the second portion of the gate structure, and
- a width of an area of the throttling portion varies along a length of the gate structure.

10. A semiconductor device structure comprising:

a body well region of semiconductor material having a first conductivity type;

a drift region of semiconductor material having a second conductivity type;

a source region of semiconductor material having the second conductivity type, a channel portion of the body well region residing laterally between the source region and a first portion of the drift region, the first portion being adjacent to the channel portion; and a gate structure overlying at least the channel portion of the body well region and the first portion of the drift region, wherein
- a second portion of the gate structure overlying the channel portion proximate the source region has the second conductivity type,
- a throttling portion of the gate structure overlies the first portion of the drift region and at least a portion of the channel portion,
- a doping of the throttling portion is different from the second portion of the gate structure, and
- a length of an area of the throttling portion that overlaps the channel portion varies along a width of the gate structure.

11. A semiconductor device structure comprising:

a plurality of body well regions of semiconductor material having a first conductivity type;

a plurality of drift regions of semiconductor material having a second conductivity type, at least a portion of each drift region being adjacent to a channel portion of at least one body well region of the plurality of body well regions;

a plurality of source regions of semiconductor material having the second conductivity type, a channel portion of the at least one body well region residing laterally between a respective source region and a respective drift region of the plurality of drift regions; and a plurality of gate structures, each gate structure overlying at least the channel portion of a respective body well region of the plurality of body well regions, wherein:
the plurality of gate structures are electrically connected; and
a threshold voltage of at least one of the gate structures of the plurality of gate structures is different than the threshold voltage of one or more remaining gate structures of the plurality of gate structures.

12. The semiconductor device structure of claim 11, wherein:
the plurality of drift regions are electrically connected; and
the plurality of source regions are electrically connected.

13. The semiconductor device structure of claim 11, wherein:
each respective gate structure includes a layer of a conductive material; and
a respective threshold voltage of each respective gate structure corresponds to a respective area of the layer of the conductive material having the first conductivity type that overlies the channel portion of the respective body well region.

14. The semiconductor device structure of claim 11, wherein a threshold voltage associated with a peripheral gate structure of the plurality of gate structures is less than a threshold voltage associated with an interior gate structure of the plurality of gate structures.

15. The semiconductor device structure of claim 11, wherein a dopant concentration of the body well region is greater than $1 \times 10^{16}/cm^3$.

16. The semiconductor device structure of claim 11, wherein threshold voltages are nonuniform across the plurality of gate structures.

17. The semiconductor device structure of claim 1, wherein the throttling portion reduces an on-state current at the portion of the channel portion.

18. The semiconductor device structure of claim 1, wherein a length of a portion of the throttling region that overlaps the portion of the channel portion influences a threshold voltage associated with the gate structure.

19. A semiconductor device structure comprising:

a body well region of semiconductor material having a first conductivity type;

a drift region of semiconductor material having a second conductivity type;

a source region of semiconductor material having the second conductivity type, a channel portion of the body well region residing laterally between the source region and a first portion of the drift region, the first portion being adjacent to the channel portion; and a gate structure overlying at least the channel portion of the body well region and the first portion of the drift region, wherein
- a second portion of the gate structure overlying the channel portion proximate the source region has the second conductivity type,
- a throttling portion of the gate structure overlies the first portion of the drift region and at least a portion of the channel portion,
- a doping of the throttling portion is different from the second portion of the gate structure, and
- a threshold voltage associated with the gate structure is nonuniform with respect to a width of the gate structure and nonuniform with respect to a length of the gate structure.

* * * * *